(12) United States Patent
Nozawa

(10) Patent No.: US 10,339,666 B2
(45) Date of Patent: Jul. 2, 2019

(54) RECOGNITION DEVICE AND RECOGNITION METHOD

(71) Applicant: FUJI CORPORATION, Chiryu-shi (JP)

(72) Inventor: Tatsuji Nozawa, Toyokawa (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/555,830

(22) PCT Filed: Mar. 6, 2015

(86) PCT No.: PCT/JP2015/056621
§ 371 (c)(1),
(2) Date: Sep. 5, 2017

(87) PCT Pub. No.: WO2016/142986
PCT Pub. Date: Sep. 15, 2016

(65) Prior Publication Data
US 2018/0047179 A1     Feb. 15, 2018

(51) Int. Cl.
*G06T 7/00*     (2017.01)
*G06T 7/70*     (2017.01)
(Continued)

(52) U.S. Cl.
CPC ............... *G06T 7/70* (2017.01); *G01B 11/00* (2013.01); *G06T 7/0004* (2013.01); *H05K 13/0813* (2018.08); *G06T 2207/30141* (2013.01)

(58) Field of Classification Search
None
See application file for complete search history.

(56) References Cited

U.S. PATENT DOCUMENTS

| 6,118,540 A | * | 9/2000 | Roy | ........................ G01N 21/88 |
| | | | | 29/759 |
| 6,207,946 B1 | * | 3/2001 | Jusoh | ................. G01N 21/8806 |
| | | | | 250/208.1 |

(Continued)

FOREIGN PATENT DOCUMENTS

| JP | 2004-294358 A | 10/2004 |
| JP | 2005-315749 A | 11/2005 |

(Continued)

OTHER PUBLICATIONS

International Search Report dated Jun. 2, 2015, in PCT/JP2015/056621, filed Mar. 6, 2015.

(Continued)

*Primary Examiner* — Kim Y Vu
*Assistant Examiner* — Nathan J Bloom
(74) *Attorney, Agent, or Firm* — Oblon, McClelland, Maier & Neustadt, L.L.P.

(57) ABSTRACT

A leaded component held by suction nozzle is imaged under three types of imaging conditions, imaging in a state illuminated by laser illumination, imaging in a state illuminated by incident illumination, and imaging in a state illuminated by side illumination and incident illumination 114. In a case in which it is not possible to appropriately recognize a position of a lead by recognition processing using image data of the first set of imaging conditions, recognition processing is performed again using image data of a second set of imaging conditions different to the first set of imaging conditions. In a case in which it is not possible to appropriately recognize a position of a lead by recognition processing using image data of the second set of imaging conditions, recognition processing is performed again using image, data of a third set of imagine conditions different to the second set of imaging conditions.

4 Claims, 7 Drawing Sheets

(51) Int. Cl.
*G01B 11/00* (2006.01)
*H05K 13/08* (2006.01)

(56) References Cited

U.S. PATENT DOCUMENTS

| | | | |
|---|---|---|---|
| 7,508,973 | B2 | 3/2009 | Okabe et al. |
| 2002/0074480 | A1 | 6/2002 | Wasserman |
| 2002/0076096 | A1 | 6/2002 | Silber et al. |
| 2008/0007725 | A1* | 1/2008 | Togashi .............. G01N 21/9501 356/237.2 |
| 2008/0055897 | A1* | 3/2008 | Yoshida ............... G02B 6/0068 362/231 |
| 2009/0033761 | A1* | 2/2009 | Cetrulo ................ H04N 5/2256 348/222.1 |

FOREIGN PATENT DOCUMENTS

| | | |
|---|---|---|
| JP | 2006-294806 A | 10/2006 |
| WO | WO 00/14517 A1 | 3/2000 |

OTHER PUBLICATIONS

Extended European Search Report dated Jan. 30, 2018 in Patent Application No. 15884484.5, citing references AA—AC and AO therein, 9 pages.

\* cited by examiner

RECOGNITION DEVICE AND RECOGNITION METHOD

TECHNICAL FIELD

The present application relates to a recognition device and recognition method for recognizing a position of an electrode of a component to be mounted on a board.

BACKGROUND ART

To mount a component on a board, it is necessary to appropriately recognize positions of electrodes of the component. To do this, with a component mounter that mounts components on a board, imaging of the component is performed, and recognition processing of positions of electrodes of the component is performed based on the image data. Various ways of imaging a component are disclosed in the patent literature below.
Patent Literature 1: JP-A-2004-294358
Patent Literature 2: JP-A-2006-294806
Patent Literature 3: JP-A-2005-315749

SUMMARY

Technical Problem

According to technology disclosed in the above patent literature, it is possible to recognize a position of an electrode of a component to a certain extent. However, it is desirable to further improve recognition of a position of an electrode of a component. The present disclosure takes account of the above circumstances, and an object thereof is to appropriately recognize a position of an electrode of a component.

Solution to Problem

To solve the above problems, the present disclosure is a recognition device for recognizing a position of an electrode of a component to be mounted on a board, the recognition device including: multiple light sources configured to apply light to the component; an imaging device configured to image the component based on light reflected by the component when light is applied to the component from at least one of the multiple light sources; a memory device configured to memorize sample image data according to each of multiple imaging conditions for each of the multiple conditions; and a data analysis device configured to recognize the position of an electrode of the component imaged by the imaging device based on sample image data memorized on the memory device and image data of the component imaged by the imaging device, the data analysis device including a data creating section configured to image the component using the imaging device according to at least two sets of imaging conditions among the multiple imaging conditions corresponding to the sample image data memorized in the memory device, and to create image data for each of the at least two sets of imaging conditions, a first determining section configured to determine whether recognition of a position of an electrode of the component imaged by the imaging device is possible based on image data according to a first set of imaging conditions from among the image data for each of the at least two sets of imaging conditions created by the data creating section and the sample image data according to the first set of imaging conditions memorized on the memory device, and a second determining section configured to, in a case in which it is determined by the first determining section that recognition of a position of an electrode of the component is not possible, determine whether recognition of a position of an electrode of the component imaged by the imaging device is possible based on image data according to a second set of imaging conditions that differ from the first set of imaging conditions from among the image data for each of the at least two sets of imaging conditions created by the data creating section and the sample image data according to the second set of imaging conditions memorized on the memory device.

To solve the above problems, the present disclosure is a recognition method for recognizing a position of an electrode of a component, applied to an item including (a) multiple light sources configured to apply light to the component, (b) an imaging device configured to image the component based on light reflected by the component when light is applied to the component from at least one of the multiple light sources, and (c) a memory device configured to memorize sample image data according to each of multiple imaging conditions for each of the multiple conditions, and that recognizes the position of the electrode of the component based on the sample image data memorized in the memory device and image data of the component imaged by the imaging device, the recognition method including: a data creating step of imaging the component using the imaging device according to at least two sets of imaging conditions among the multiple imaging conditions corresponding to the sample image data memorized in the memory device, and creating image data for each of the at least two sets of imaging conditions, a first determining step of determining whether recognition of a position of an electrode of the component imaged by the imaging device is possible based on image data according to a first set of imaging conditions from among the image data for each of the at least two sets of imaging conditions created by the data creating section and the sample image data according to the first set of imaging conditions memorized on the memory device, and a second determining step of, in a case in which it is determined in the first determining step that recognition of a position of an electrode of the component is not possible, determining whether recognition of a position of an electrode of the component imaged by the imaging device is possible based on image data according to a second set of imaging conditions that differ from the first set of imaging conditions from among the image data for each of the at least two sets of imaging conditions created by the data creating section and the sample image data according to the second set of imaging conditions memorized on the memory device.

Advantageous Effects

With the recognition device and recognition method of the present disclosure, in a case in which it is not possible to appropriately recognize a position of an electrode by recognition processing using image data of a first set of imaging conditions, recognition processing is performed again using image data of a second set of imaging conditions different to the first set of imaging conditions. In this manner, by performing recognition processing based on two types of image data with different imaging conditions, it is possible to appropriately recognize a position of an electrode based on image data imaged under various conditions.

DESCRIPTION OF PREFERRED EMBODIMENTS

The following describes in detail referring to the figures an example embodiment of the present disclosure.

Configuration of Component Mounter

Figure 1:
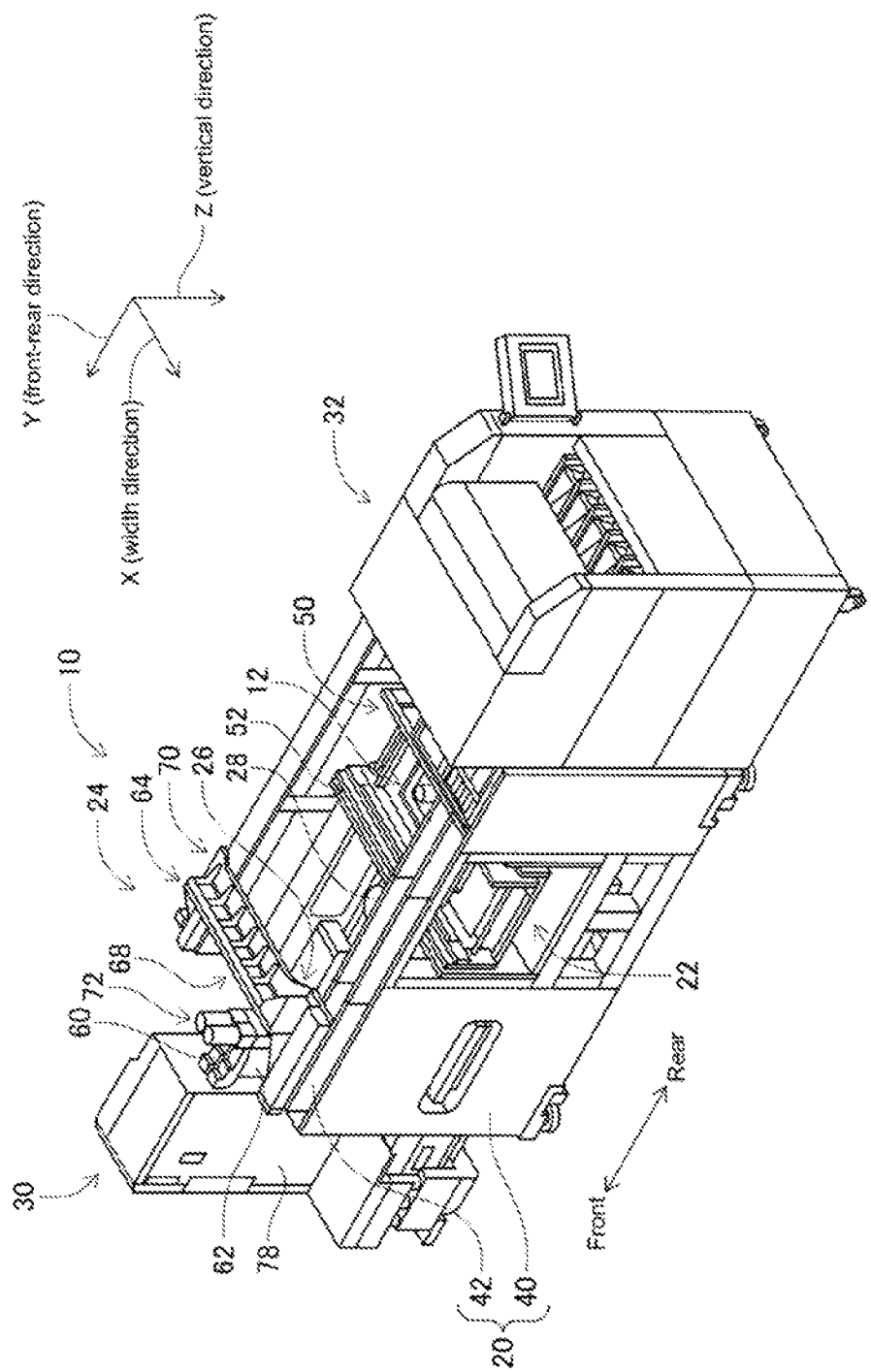
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, and control device (refer to FIG. 3) 34. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
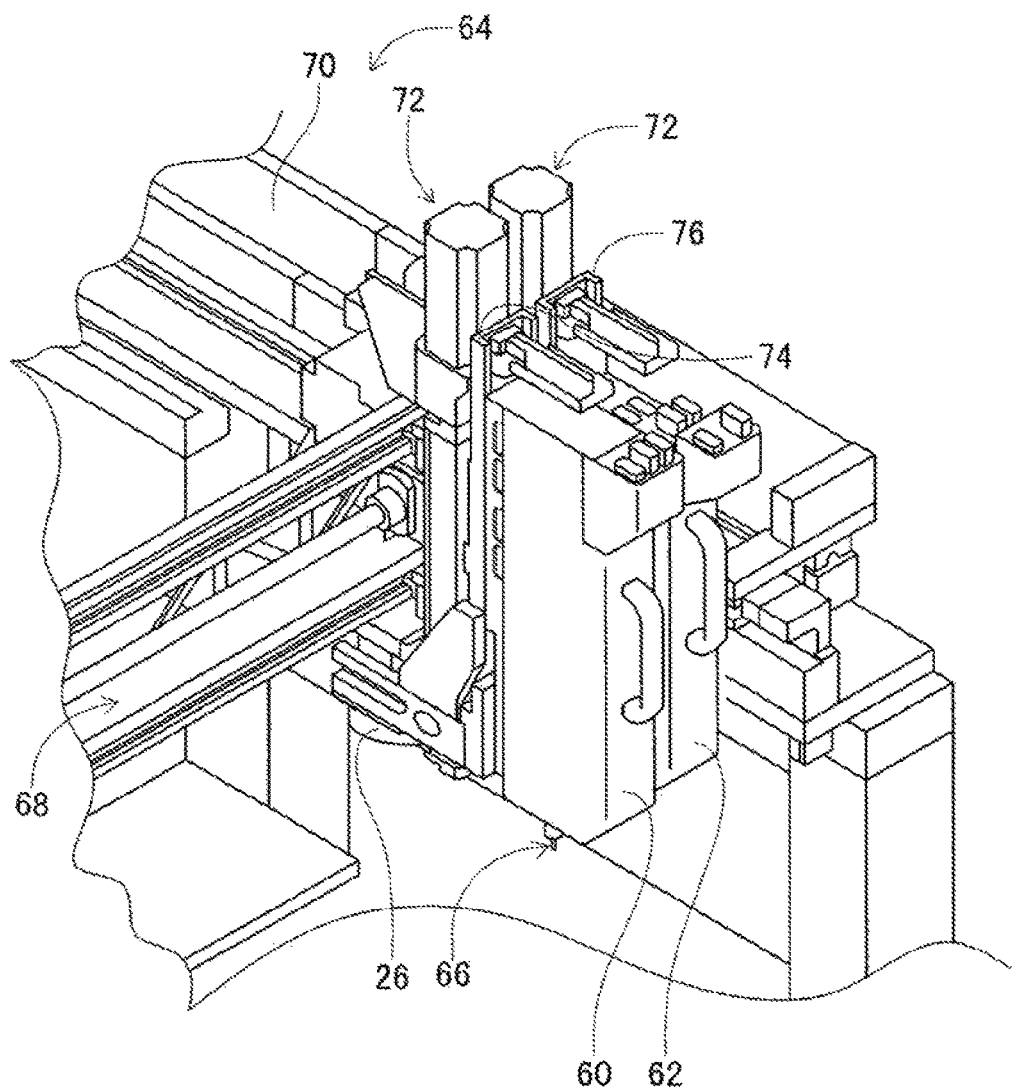
FIG. 2 is a perspective view of a component mounting device of the component mounter.

Component mounting device 24 is provided on beam section 42, and includes work heads 60 and 62 and work head moving device 64. As shown in FIG. 2, suction nozzle 66 is provided on a lower surface of each work head 60 and 62, with a component being picked up and held by the suction nozzle 66. Further, work head moving device 64 includes X-direction moving device 68, Y-direction moving device 70, and 7-direction moving device 72. Work heads 60 and 62 are moved together to any position on frame 40 by X-direction moving device 68 and Y-direction moving device 70. Also, work head 60 and 62 are detachably attached to sliders 74 and 76 respectively, and 7-direction moving device 72 moves sliders 74 and 76 in a vertical direction individually. That is, work heads 60 and 62 are moved in a vertical direction individually by Z-direction moving device 72.

Mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveying and holding device 22 and component supply device 30. Thus, component camera 28 images a component held by suction nozzle 66 of work heads 60 or 62.

Component supply device 30 is provided at an end of frame section 40 in the front-rear direction. Component supply device 30 includes tray-type component supply device 78 and feeder-type component supply device (refer to FIG. 3) 80. Tray-type component supply device 78 supplies components in a state arranged in a tray. Feeder-type component supply 80 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. Note that, components supplied by component supply device 30 and loose component supply device 32 may include electronic circuit components, configuration components of solar panels, configuration components of power modules, and the like. Also, electronic circuit components include components with leads and components without leads.

Control device 34 is provided with controller 82, multiple drive circuits 86, and image processing device 88. The multiple drive circuits 86 are connected to conveyance device 50, clamp device 50, work heads 60 and 62, work head moving device 64, tray type component supply device 78, feeder type component supply device 80, and loose component supply device 32. Controller 82 is provided with a CPU, ROM, RAM, and so on, is formed mainly from a computer, and includes data storage region 96 and data analysis region 98. Data storage region 96 is a region that memorizes various data; data analysis region 98 is a region that analyzes various data. Also, controller 82 is connected to the multiple drive circuits 86. By this, operation of board conveying and holding device 22, component mounting device 24, and so on is controlled by controller 82. Further, controller 82 is also connected to image processing device 88. Image processing device 88 is for processing image data acquired by mark camera 26 and component camera 28, and controller 82 acquires various information from the image data.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, mark camera 26 moves above circuit board 12 and images circuit board 12. By this, information related to a holding position of circuit board 12 is obtained. Also, component supply device 30 or loose component supply device 32 supplies components at a specified supply position. One of the work heads 60 or 62 moves above the component supply position and holds a component using suction nozzle 66. Continuing, work head 60 or 62 holding a component is moved above component camera 28, and the component held by suction nozzle 66 is imaged by component camera 28. Accordingly, information related to the holding position of the component is obtained. Continuing, work head 60 or 62 holding the component moves above circuit board 12, and corrects the error in the holding position of circuit board 12 and the error in the holding position of the component and so on. Then, the component is mounted on circuit board 12 by being released by suction nozzle 66.

Analysis of component information based on image data from the component camera

As given above, with component mounter 10, in order to mount a component held by suction nozzle 66 on circuit board 12, it is necessary to appropriately acquire information related to the holding position and the like of the component by suction nozzle 66. In particular, if the component to be mounted on circuit board 12 is an electronic circuit component with a lead (also referred to as a "leaded component"), it is necessary to appropriately acquire information related to a position of a tip of the lead.

Figure 4:
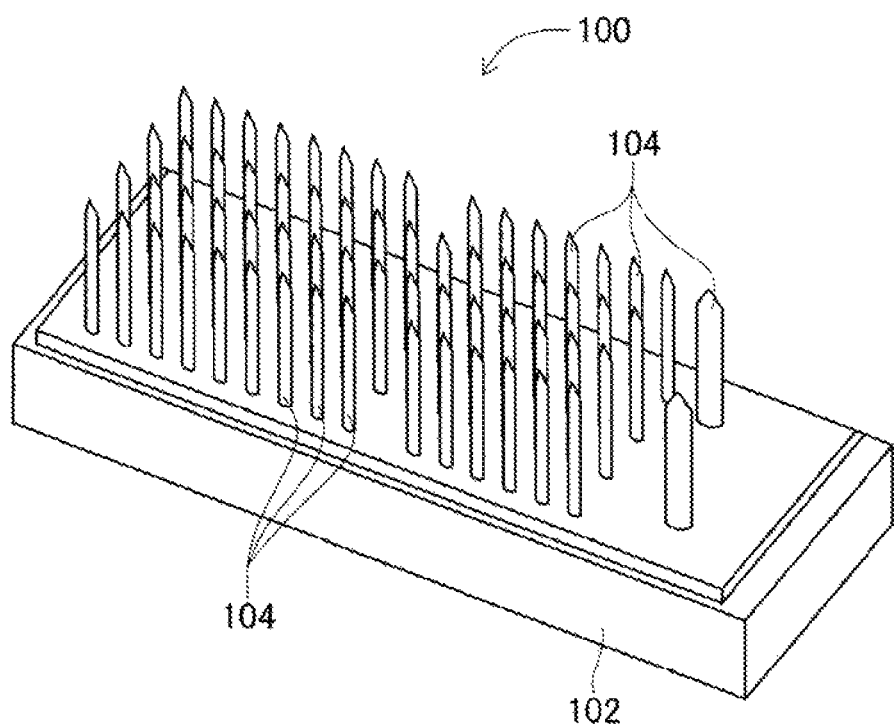
FIG. 4 is a perspective view showing a leaded component.

In details, as shown in FIG. 4, leaded component 10 is configured from component main body section 102, and multiple leads 104 protruding from one of the surfaces of component main body section 102. And, those multiple leads 104 are to be inserted into through-holes formed in circuit board 12. Therefore, to appropriately insert leads 104 into the through-holes, it is necessary to appropriately acquire information related to the tips of the leads. However, depending on the shape and so on of the tips of leads 104, it may not be possible to appropriately recognize the position of the tips of leads 104.

Taking this into account, with component mounter 10, when leaded component 100 held by suction nozzle 66 is imaged by component camera 28, imaging is performed multiple times while changing the imaging conditions, and recognition of the tips of leads 104 is performed based on image data created from the multiple imagings.

Figure 5:
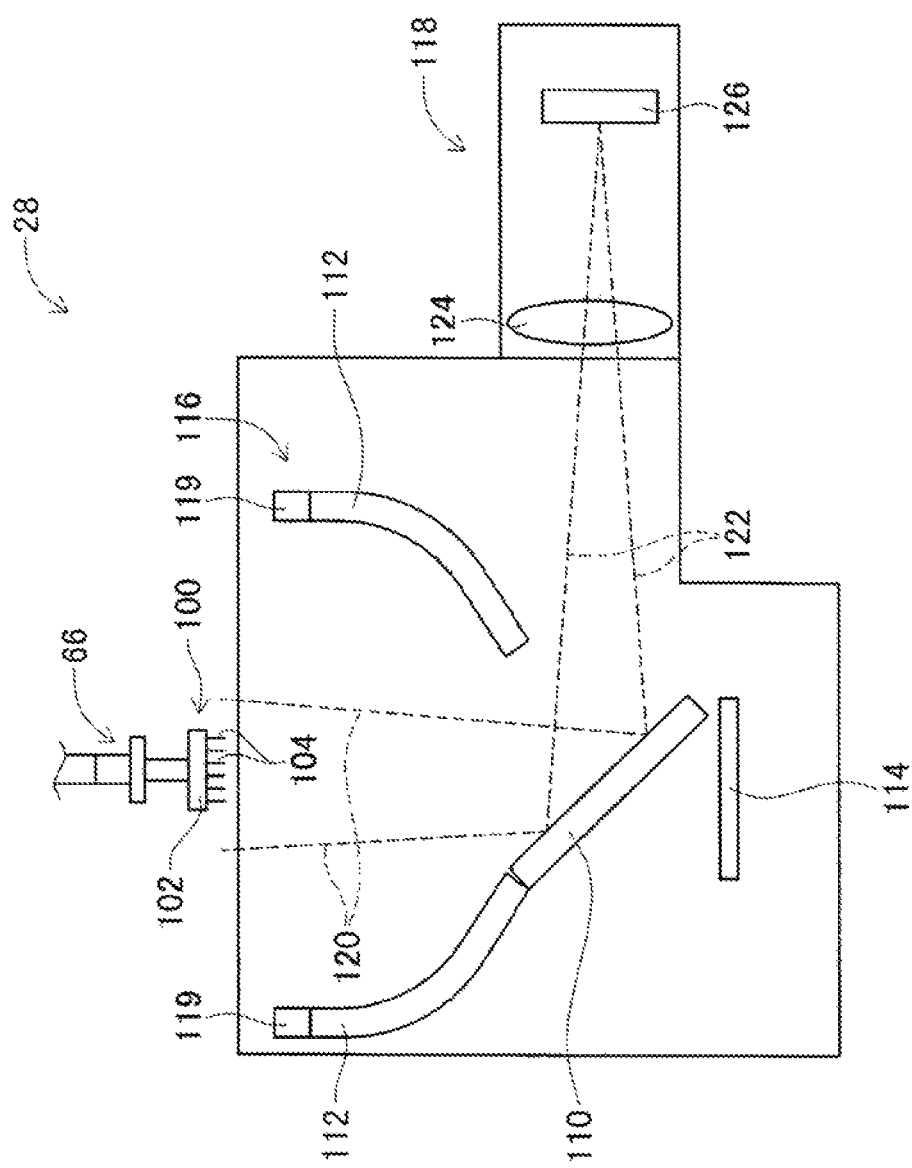
FIG. 5 is a schematic view of a component camera.

Specifically, as shown in FIG. 5, component camera 28 is provided with mirror 110, side illumination 112, incident illumination 114, laser illumination 116, and imaging device 118. Mirror 110 is arranged at a 45 degree angle below suction nozzle 66 holding leaded component 100 that is to be imaged. Note that, the reflectance of mirror 100 is 50%, and the permeability is 50%.

Also, side illumination 112 is approximately round, protruding up towards the outside edge. That is, side illumination 112 is like a bowl with the base removed. Also, side illumination 112 is arranged between mirror 110 and leaded component 100 held by suction nozzle 66. Note that, an axis line of suction nozzle 66 and a center of round side illumination 112 are approximately aligned in a vertical direction. By this, side illumination 112 shines light diagonally from below towards leaded component 100 held by suction nozzle 66.

Also, incident illumination 114 is arranged below mirror 110 facing up. By this, incident illumination 114 shines light directly from below towards leaded component 100 held by suction nozzle 66 via mirror 110 and an internal diameter section of side illumination 112.

Also, laser illumination 116 is configured from four laser emitting devices 119 (only two of the laser emitting devices are shown in the figure). The four laser emitting devices 119 are arranged at four evenly spaced positions on an outer edge of side illumination 112. By this, laser illumination 116, using four laser emitting devices 119, shines laser light towards leaded component 100 held by suction nozzle 66 from four side locations. Note that, because laser light does not diffuse, laser illumination 116 illuminates the tips of leads 104 of leaded component 100 held by suction nozzle 66 in a pinpoint manner.

Light emitted from at least one of side illumination 112, incident illumination 114, or laser illumination 116 is reflected by leaded component 100 held by suction nozzle 66, and hits mirror 110 via a light path (the path between the two dotted lines 120). Then, 50% of the light that hits mirror 110 is reflected by mirror 110 and hits imaging device 118 along a light path (the path between the two dotted lines 122). This is because the reflectance of mirror 110 is 50%.

Imaging device 118 has lens 124 and imaging element 126, and light that hits imaging device 118 is detected by imaging element 126 via lens 124. By this, an image from the lower side of leaded component 100 held by suction nozzle 66, that is, image data of the tips of leads 104, is obtained. Also, sample image data according to imaging conditions is memorized on data storage region 96 of controller 82. And, the positions of the tips of leads 104 are recognized by sample image data memorized in data storage region 96 and image data of component camera 28 being analyzed by data analysis region 98 of controller 82. In this manner, it is possible to recognize the positions of the tips of leads 104 by imaging leaded component 100 held by suction nozzle 66 using component camera 28.

Figure 6:
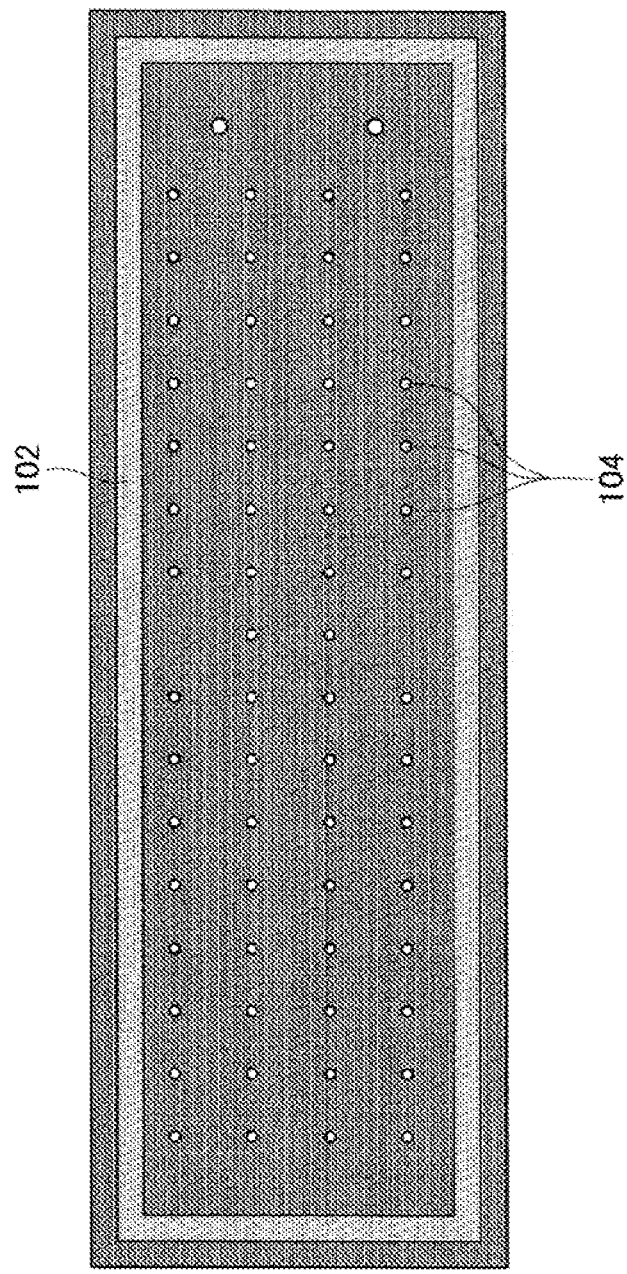
FIG. 6 shows an image captured using incident illumination imaging.

However, because the path of the light reflected by leaded component 100 differs according to the light source that applies the light to leaded component 100, there are cases in which it is difficult to appropriately recognize the positions of the tips of leads 104. Specifically, for example, when light is shone on leaded component 100 by incident illumination 114, light reflected from below leaded component 100 is reflected by the lower side of leaded component 100, and imaging is performed based on that reflected light (this is also referred to as "incident illumination imaging"). An example of an image obtained from this incident illumination imaging (also referred to as "incident illumination image") is shown in FIG. 6. In this image, the image of the tips of leads 104 is clear. However, because light reflected from below leaded component 100 is reflected by component main body section 102 as well as leads 104, component main body section 102 appears in the incident illumination image as well as leads 104. Therefore, when analyzing the image data, there is a problem of mixing up an image of lead 104 and an image of component main body section 102, meaning that recognition of the positions of the tips of leads 104 may not be performed appropriately.

Figure 7:
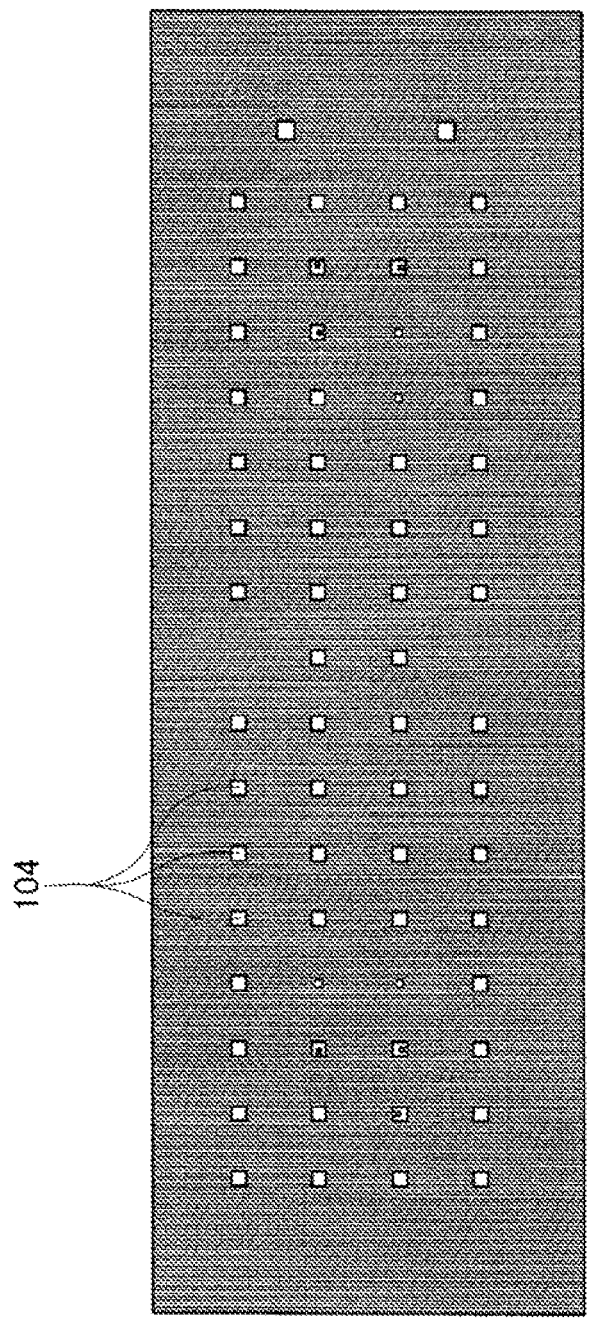
FIG. 7 shows an image captured using laser illumination imaging.

Also, for example, when laser light from laser illumination 116 illuminates in a pinpoint manner the tips of leads 104 of leaded component 100, light shone from the side of the tips of leads 104 is reflected by the tips of leads 104, and imaging is performed based on that reflected light (this is also referred to as "laser illumination imaging"). An example of an image obtained from this laser illumination imaging (also referred to as "laser illumination image") is shown in FIG. 7. In this image, the image of a portion of the tips of the multiple leads 104 is unclear. This is because, for example, in a case in which the end surface of a tip of lead 104 is flat surface perpendicular to an axis line of the lead 104, light reflected by the end surface of the tip of the lead 104 is detected by imaging element 126 without entering the light path (the path between the two dotted lines 120 in FIG. 5). If data analysis is performed based on this kind of laser illumination image, not only are the positions of the tips of leads 104 not recognized appropriately, but it may be determined that a lead 104 is damaged. In such a case, a good leaded component 100 may be determined to be a defective leaded component 100 with a damaged lead 104, leading to a good leaded component 100 being discarded.

Considering this issue, with component mounter 10, imaging of leaded component 100 is performed multiple times according to multiple imaging conditions with changed lighting patterns of applying light to leaded component 100, and recognition of the positions of the tips of leads 104 is performed based on image data created from the multiple imagings. Specifically, when imaging leaded component 100 held by suction nozzle 66, three types of imagings are performed: incident illumination imaging, laser illumination imaging, and all illumination imaging. Note that, all illumination imaging is applying light to leaded component 100 held by suction nozzle 66 using both side illumination 112 and incident illumination 114, with light shone on leaded component 100 from directly below and from diagonally below being reflected by the lower surface of leaded component 100, and imaging being performed based on that reflected light.

Also, memorized in data storage region 96 of controller 82 are sample image data according to imaging conditions of incident illumination imaging, sample image data according to imaging conditions of laser illumination imaging, and sample image data according to imaging conditions of all illumination imaging. And, when the three types of imagings—incident illumination imaging, laser illumination imaging, and all illumination imaging—are performed by component camera 28, first, recognition processing of the positions of tips of leads 104 is performed by analyzing image data obtained by laser illumination imaging and sample image data according to imaging conditions of laser illumination imaging in data analysis region 98 of controller 82. Here, in a case in which the positions of all of the multiple leads 104 of leaded component 100 are appropriately recognized by the recognition processing, that is, in a case in which recognition processing is performed appropriately, work of mounting leaded component 100 on circuit board 12 is performed based on the processing result. Also, information indicating that recognition processing was performed appropriately according to image data of laser illumination processing is memorized in data storage region 96.

In a case in which the positions of the tips of all the multiple leads 104 of leaded component 100 could not be recognized appropriately by recognition processing using image data of laser illumination imaging, that is, in a case in which recognition processing could not be performed appropriately, recognition processing of the positions of tips of leads 104 is performed by analyzing image data obtained by incident illumination imaging and sample image data according to imaging conditions of incident illumination imaging in data analysis region 98 of controller 82. Here, in a case in which recognition processing is performed appropriately, work of mounting leaded component 100 on circuit board 12 is performed based on the processing result. Also, information indicating that recognition processing was performed appropriately according to image data of incident illumination processing is memorized in data storage region 96.

Further, in a case in which recognition processing could not be performed appropriately using image data of incident illumination imaging, recognition processing of the positions of tips of leads 104 is performed by analyzing image data obtained by all illumination imaging and sample image data according to imaging conditions of all illumination imaging in data analysis region 98 of controller 82. Here, in a case in which recognition processing is performed appropriately, work of mounting leaded component 100 on circuit board 12 is performed based on the processing result. Also, information indicating that recognition processing was performed appropriately according to image data of all illumination processing is memorized in data storage region 96.

Further, in a case in which recognition processing could not be performed appropriately using image data of all illumination imaging, that leaded component 100 is determined to be a defective component with a damaged lead 104 or the like, and is discarded. In this manner, with component mounter 10, in a case in which it is not possible to appropriately recognize a position of a lead 104 by recognition processing using image data of a first set of imaging conditions, recognition processing is performed again using image data of a second set of imaging conditions different to the first set of imaging conditions. Also, in a case in which it is not possible to appropriately recognize a position of a lead 104 by recognition processing using image data of the second set of imaging conditions, recognition processing is performed again using image data of a third set of imaging conditions different to the second set of imaging conditions. In this manner, by performing recognition processing based on three types of image data with different imaging conditions, it is possible to appropriately recognize a tip of lead 104 based on image data imaged obtained using various reflected light. By this, incorrectly determining a good leaded component 100 as a defective component is prevented, and it is possible to appropriately recognize the positions of tips of leads 104.

Note that, in the above descriptions, recognition processing was performed in an order of recognition processing using image data of laser illumination imaging, recognition processing using image data of incident illumination imaging, and recognition processing using image data of all illumination imaging, such that recognition processing is performed in order of the higher recognition rate. In detail, each time information indicating recognition processing was performed appropriately according to image data of a given illumination processing is memorized in data storage region 96, the ratio of the number of times recognition processing was performed appropriately to the total number times recognition processing was performed, that is, the recognition rate, is calculated. Thus, from among recognition processing using image data of laser illumination imaging, recognition processing using image data of incident illumination imaging, and recognition processing using image data of all illumination imaging, it is possible to perform recognition processing in order of the higher recognition rate. By this, the time required for recognition processing is reduced.

Figure 3:
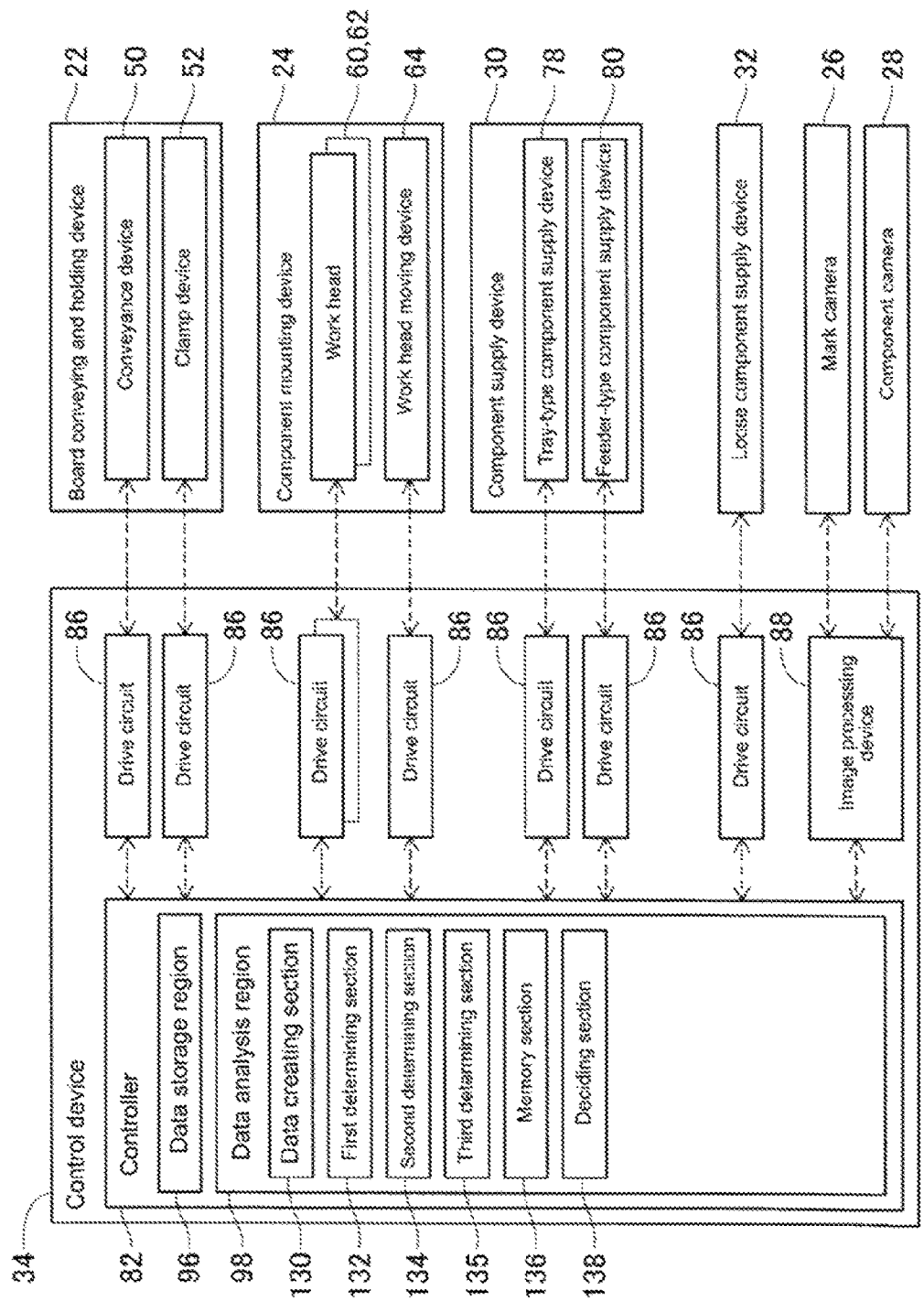
FIG. 3 is a block diagram showing a control device of the component mounter.

Note that, as shown in FIG. 3, provided in data analysis region 98 of controller 82 are data creating section 130, first determining section 132, second determining section 134, third determining section 135, memory section 136, and deciding section 138. Data creating section 130 is a functional section for creating image data for each of the multiple imaging conditions. First determining section 132 is a functional section for performing recognition processing using image data of a first set of imaging conditions. Second determining section 134 is a functional section for performing recognition processing using image data of a second set of imaging conditions. Third determining section 135 is a functional section for performing recognition processing using image data of a third set of imaging conditions. Memory section 136 is a functional section for memorizing information indicating that recognition processing was performed appropriately according to image data of given imaging conditions in data storage region 96. Deciding section 138 is a functional section for deciding the order of performing recognition processing according to recognition rate.

Further, the present disclosure is not limited to the above example embodiments, and various changed or improved methods of embodiment are possible based on the knowledge of someone skilled in the art. Specifically, for example, in the above embodiment, when imaging leaded component 100, three types of imagings are performed—incident illumination imaging, laser illumination imaging, and all illumination imaging—but imaging may be performed using a lighting pattern different to the lighting pattern during those three types of imagings. Specifically, imaging during illumination by side illumination 112; imaging during illumination by side illumination 112 and laser illumination 116; imaging during illumination by incident illumination 114 and laser illumination 116; or imaging during illumination by side illumination 112, incident illumination 114, and laser illumination 116 may be performed.

Further, it is possible to use side illumination for which lighting is independently controlled for an upper portion of side illumination 112, a lower portion of side illumination 112, and a central portion of side illumination 112 between the upper portion and the lower portion. With such side illumination, by changing the lighting pattern of the three portions, it is possible to image leaded component 100 under even more types of imaging conditions.

Further, in the above embodiment, imaging conditions are changed by changing the lighting pattern of a light source, but imaging conditions may be changed by changing the exposure time of imaging device 118, that is, by changing the shutter speed. Also, imaging conditions may be changed by changing the height of the component that is the imaging target, that is, by changing the distance between the component that is the imaging target and imaging device 118.

Also, in the above embodiments, the present disclosure is applied to recognition processing of the positions of leads 104 of leaded component 100, but the present disclosure may be applied to an electrode of an electronic circuit component without leads, such as for recognition processing for the positions of bumps of a component.

REFERENCE SIGNS LIST

28: component camera (recognition device); 96: data storage region (memory device); 98: data analysis region (data analysis device); 100: leaded component (component); 112: side illumination (light source); 114: incident illumination (light source); 116: laser illumination (light source); 118: imaging device; 130: data creating section; 132: first determining section; 134: second determining section; 136: memory section; 138 deciding section

The invention claimed is:

1. A recognition device for recognizing a position of an electrode of a component to be mounted on a board, the recognition device comprising:
multiple light sources configured to apply light to the component, the multiple light sources including a first light source and a second light source;
an imaging device configured to image the component based on light reflected by the component when light is applied to the component from at least one of the multiple light sources;
a memory device configured to memorize sample image data according to each of multiple imaging conditions for each of the multiple conditions; and
a controller configured to
recognize the position of an electrode of the component imaged by the imaging device based on sample image data memorized on the memory device and image data of the component imaged by the imaging device,
image the component using the imaging device according to at least two sets of imaging conditions among the multiple imaging conditions corresponding to the sample image data memorized in the memory device, and to create image data for each of the at least two sets of imaging conditions,
determine whether recognition of a position of an electrode of the component imaged by the imaging device is possible based on image data according to a first set of imaging conditions from among the image data for each of the at least two sets of imaging conditions and the sample image data according to the first set of imaging conditions memorized on the memory device, the first set of imaging conditions based on illumination from the first light source,
in a case in which it is determined that recognition of a position of an electrode of the component is not possible, determine whether recognition of a position of an electrode of the component imaged by the imaging device is possible based on image data according to a second set of imaging conditions that differ from the first set of imaging conditions from among the image data for each of the at least two sets of imaging conditions and the sample image data according to the second set of imaging conditions memorized on the memory device, the second set of imaging conditions based on illumination from the second light source,
memorize on the memory device a number of recognitions of the component made based on the first set of imaging conditions or the second set of imaging conditions,
determine which of the first set of imaging conditions or the second set of imaging conditions has a higher recognition rate based on the number of recognitions, and
decide an order of a next component recognition based on the higher recognition rate.

2. The recognition device according to claim 1, wherein the multiple imaging conditions are at least one of imaging conditions in which a combination of light sources that apply light to the component being imaged by the imaging device is different, imaging conditions in which the imaging time by the imaging device is different, or imaging conditions in which a distance between the imaging device and the component being imaged by the imaging device is different.

3. The recognition device of claim 1, wherein the recognition device is a device for recognizing a position of a tip of a lead of a leaded component to be mounted on a board.

4. A recognition method for recognizing a position of an electrode of a component, applied to an item including (a) multiple light sources configured to apply light to the component, (b) an imaging device configured to image the component based on light reflected by the component when light is applied to the component from at least one of the multiple light sources, the multiple light sources including a first light source and a second light source, and (c) a memory device configured to memorize sample image data according to each of multiple imaging conditions for each of the multiple conditions, and that recognizes the position of the electrode of the component based on the sample image data memorized in the memory device and image data of the component imaged by the imaging device, the recognition method comprising:
a data creating step of imaging the component using the imaging device according to at least two sets of imaging conditions among the multiple imaging conditions corresponding to the sample image data memorized in the memory device, and creating image data for each of the at least two sets of imaging conditions, a first determining step of determining whether recognition of a position of an electrode of the component imaged by the imaging device is possible based on image data according to a first set of imaging conditions from among the image data for each of the at least two sets of imaging conditions and the sample image data according to the first set of imaging conditions memorized on the memory device, the first set of imaging conditions based on illumination from the first light source, a second determining step of, in a case in which it is determined in the first determining step that recognition of a position of an electrode of the component is not possible, determining whether recognition of a position of an electrode of the component imaged by the imaging device is possible based on image data according to a second set of imaging conditions that differ from the first set of imaging conditions from among the image data for each of the at least two sets of imaging conditions and the sample image data according to the second set of imaging conditions memorized on the memory device, the second set of imaging conditions based on illumination from the second light source memorizing on the memory device a number of recognitions of the component made based on the first set of imaging conditions or the second set of imaging conditions, determine which of the first set of imaging conditions or the second set of imaging conditions has a higher recognition rate based on the number of recognitions, and deciding an order of a next component recognition based on the higher recognition rate.

* * * * *